United States Patent [19]

Kitano

[11] Patent Number: 5,779,797
[45] Date of Patent: Jul. 14, 1998

[54] WAFER BOAT FOR VERTICAL DIFFUSION AND VAPOR GROWTH FURNACE

[75] Inventor: Tomohisa Kitano, Tokyo, Japan

[73] Assignee: NEC Corporation, Tokyo, Japan

[21] Appl. No.: 747,086

[22] Filed: Nov. 13, 1996

[30] Foreign Application Priority Data

Nov. 15, 1995 [JP] Japan ................................ 7-297004

[51] Int. Cl.$^6$ ................................................ C23C 16/00
[52] U.S. Cl. .......................... 118/500; 118/728; 118/724; 432/241
[58] Field of Search ................................ 118/728, 724, 118/500; 432/241

[56] References Cited

U.S. PATENT DOCUMENTS

| | | | |
|---|---|---|---|
| 5,169,453 | 12/1992 | Takagi | 118/728 |
| 5,169,684 | 12/1992 | Takagi | 427/248.1 |
| 5,310,339 | 5/1994 | Ushikawa | 432/253 |
| 5,393,349 | 2/1995 | Ohkase | 118/725 |
| 5,492,229 | 2/1996 | Tanaka et al. | 211/41 |
| 5,516,283 | 5/1996 | Schrems | 431/241 |
| 5,536,918 | 7/1996 | Ohkase et al. | 219/390 |
| 5,556,275 | 9/1996 | Sakata et al. | 432/241 |
| 5,618,351 | 4/1997 | Koble, Jr. et al. | 118/728 |

FOREIGN PATENT DOCUMENTS

| | | |
|---|---|---|
| 61-191015 | 8/1986 | Japan . |
| 2-17633 | 1/1990 | Japan . |
| 2-102523 | 4/1990 | Japan . |

OTHER PUBLICATIONS

Meriam et al. Engineering Mechanics, vol. 1 Statics, John Wiley & Sons, Inc., pp. 241–243, 1992.
Reif, Understanding Basic Mechanics, John Wiley & Sons, Inc., pp. 181–183, 1995.
Wolfe, C. et al., Physical Properties of Semiconductors, Prentice Hall, Englewood Clifs, NJ, pp. 16, 17, 1989.
Wolf,S> et al., Silicon Processing for the VLSI Era, vol. 1, Process Technology, Lattice Press, pp. 1–5, 1986.

Primary Examiner—R. Bruce Breneman
Assistant Examiner—Jeffrie R. Lund
Attorney, Agent, or Firm—Foley & Lardner

[57] ABSTRACT

A wafer boat having a structure for supporting a plurality of wafers one above another at an interval. The structure includes a plurality of support posts disposed upright and essentially perpendicular to principal surfaces of the wafers at positions around the wafers, and a plurality of supporting bars each of which extends laterally from each of the support posts and supports a wafer back at positions thereof spaced apart from a center of the wafer by a distance corresponding to two-thirds of the radius of the wafer. The wafers may be (001)-wafers, and the supporting bars may support the wafer back at positions thereof corresponding to [100] or [110] crystal orientation. The arrangement enables the reduction of the stress generated due to the weight of the wafer.

5 Claims, 7 Drawing Sheets

WAFER BOAT FOR VERTICAL DIFFUSION AND VAPOR GROWTH FURNACE

BACKGROUND OF THE INVENTION (1) Field of the Invention

The present invention relates to wafer boats for vertical heat treatment equipment, and more particularly to wafer boats for vertical diffusion furnaces and vertical vapor growth furnaces.

(2) Description of the Related Art

Prior art wafer boats provided in vertical diffusion furnaces and vapor growth furnaces have a problem in that a heat conductivity difference between the processed wafer and the wafer supporting region in contact with the wafer causes heat strain, consequently generating crystal defects in the wafer. A wafer boat proposed to solve this problem is adapted to support wafers at three or four points. Specifically, the wafer boat has a wafer support having boat support posts and supporting bars projecting from the boat support posts, and supports each wafer such that the edge face and the back surface of a peripheral portion adjacent to the edge of the wafer are in plane contact with the boat support ports and supporting bars (see Japanese Patent Application Kokai Publication No. Sho. 61-191015).

Each of the boat support posts is provided with grooves each having a gap slightly larger than the thickness of the wafer, and the edge face and the back surface of the peripheral portion adjacent to the edge of the supported wafer are in plane contact with the groove surfaces.

The peripheral portion of the wafer is held in contact with the support portions of the wafer boat over a large area. Therefore, minute scratches may occur in the peripheral portion of the wafer when the wafer is put into and taken out of the wafer boat. In addition, the thermal conductivity difference may generate crystal defects in the contact portions of the wafer. A wafer boat proposed to solve these problems is disclosed in Japanese Patent Application Kokai Publication No. Hei 2-17633 and Japanese Patent Application Kokai Publication No. Hei 2-102523. FIG. 1 shows the disclosed wafer boat. As shown, the wafer boat has a plurality of support posts 9 erected to be essentially perpendicular to the principal surface of the wafer and lateral supporting bars 10 extending from the support posts. Each wafer 8 is supported such that its back surface 11 is in point or line contact at positions thereof spaced apart by about 1 cm from its edge with the supporting bars 10.

As a consequence of the trend of increasing wafer diameter, in wafers having diameters that exceed about 30 cm (12 inches), bending of the wafers results due to the weight thereof, which eventually causes crystal defects such as slip defects. FIG. 2 shows the maximum stress generated in a wafer due to its weight when a peripheral portion of the wafer is maintained at 1,200° C., the maximum stress shown being obtained through calculation of various diameters and thicknesses of the wafer by a finite element method using an ANYSIS program.

With a usual 6-inch wafer having a thickness of 0.7 mm, a maximum stress of 0.0235 kgf/mm² is generated. With a 12-inch wafer having the same thickness, the maximum stress is 0.094 kgf/mm². It will be seen that, in order to suppress the stress generated in the 12-inch wafer to a value of that of the 6-inch wafer having the same weight, a thickness of about 3 mm is necessary. This is unrealistic from both the economic and production points, such as transport of wafers. The generation of crystal defects due to the weight of wafer is more serious than the generation of crystal defects due to the thermal conductivity difference between the wafer and the support portions of the wafer boat.

Development of a wafer boat, which is suited for suppressing crystal defects generated due to the weight of a wafer, is indispensable. In connection with this, it is also necessary to take into consideration the suppression of slip defects generated by thermal stress due to temperature difference within the wafer surface.

SUMMARY OF THE INVENTION

An object of the invention, therefore, is to overcome the problems existing in the prior art, and to provide a wafer boat for a vertical furnace that can reduce stress in the wafer caused by the weight thereof with a usual wafer thickness even where the diameter of the wafer increases to about 30 cm (12 inches), and that is less susceptible to the effects of thermal stress.

According to one aspect of the invention, there is provided a wafer boat for use with vertical furnaces and having a structure for supporting a plurality of wafers one above another at an interval, the structure comprising:

a plurality of support posts disposed upright and essentially perpendicular to principal surfaces of the wafers at positions around the wafers, and a plurality of supporting bars each extending laterally from each of the support posts and supporting a back surface of each of the wafers at positions thereof spaced apart from a center of the wafer by a distance corresponding to two-thirds of the radius of the wafer.

The wafer is (001)-wafer, and the support bars may support the wafer back at positions thereof along |100|, i.e., <100>, <010>, <$\bar{1}$00>, and <0$\bar{1}$0>, or [110], i.e., <$\bar{1}\bar{1}$0>, <1$\bar{1}$0>, <110>, and <$\bar{1}$10>, crystal orientation.

The supporting bars may support the wafer back in point contact therewith, in line contact therewith, or in line plane contact therewith.

According to the invention, stress generated in a wafer due to the weight thereof, is reduced by supporting the back of the wafer at positions thereof spaced apart from the center of the wafer by a distance corresponding to two-thirds of the radius (r) of the wafer by the supporting bars each extending from each of a plurality of upright support posts essentially perpendicular to the principal surface of the wafer. FIG. 3 shows the maximum stress, at a temperature of 1,200° C., that is generated in a wafer having diameter of about 30 cm (12 inches) in size and having a thickness of 0.7 mm, the stress being calculated for cases when the back of the wafer is supported at various positions. The calculation was made by a finite element method using an ANYSIS program.

When the peripheral portion of the wafer is supported, a maximum stress of 0.094 kgf/mm² is generated as mentioned above. When the wafer is supported at positions spaced apart from the wafer center by a distance corresponding to one-third of the wafer radius, a maximum stress of 0.112 kgf/mm² is generated. When the wafer is supported at positions spaced apart from the wafer center by a distance corresponding to two-thirds of the wafer diameter, the maximum stress is 0.028 kgf/mm², which means that the stress generated due to the weight of the wafer is reduced.

Usually, the position at which the stress is minimized in a uniform disk shape is at a position spaced by two-thirds of the radius from the center of the circle. This means that the stress due to the weight of the wafer can be minimized by supporting the wafer at the position two-thirds of the radius of the wafer from the center thereof. As indicated by the above calculation results, even with a wafer having a diameter of about 30 cm (12 inches) in size and having a thickness of 0.7 mm, the maximum stress generated due to the weight of the wafer can be suppressed to approximately a value of 0.0235 kgf/mm$^2$, which is the stress generated in a wafer having a diameter of about 15 cm (6 inches) in size when the peripheral portion of the wafer is supported, by supporting a wafer region spaced apart from the wafer center by a distance corresponding to two-thirds of the wafer radius.

The dependency of the stress generated by the weight of wafer on the position of support by wafer boat, is verified by using an X-ray diffraction method by using Cu as a source of radiation and a (001) silicon crystal having a thickness of 1 cm, with which the warping can be ignored, as a monochrometer. An X-ray diffraction optical system sensitive to strain was built by setting (+, −) parallel positioning between the monochrometer crystal and the (001)-wafer held at the wafer boat supporting position.

Using this optical system a rocking curve was obtained from (400) reflection from the wafer, and the half width was obtained from the rocking curve. FIG. 4 shows the dependency of the half width thus obtained on the wafer boat supporting position. The half width has a minimum value of about 25 cm (10 inches) when the wafer is supported by the wafer boat at positions spaced by a distance corresponding to two/thirds of its radius from the center. When the spaced-apart distance from the center of the wafer is further increased by an amount corresponding to more than two-thirds of the radius of the wafer, the half width increases, thus indicating an increase of the stress generated by the weight of the wafer. From the above result, it is seen that the strain generated in the wafer by the weight thereof can be minimized by supporting the wafer at positions thereof spaced apart by a distance corresponding to two-thirds of the radius of the wafer. Minimizing the stress in this way is effective for suppressing slip defects caused by the weight of the wafer. The above results was obtained with a wafer thickness of 0.7 μm. The half width varies with the wafer thickness. However, irrespective of wafer thickness variations, the half width is minimum when the wafer is supported by the wafer boat at positions spaced apart from the center of the wafer by a distance corresponding to two-thirds of the wafer radius.

According to the invention, slip of a (001)-wafer is suppressed because the back of the (001)-wafer is supported at [100] or [110] crystal orientation by supporting bars each extending from each of a plurality of upright support posts essentially perpendicular to the principal surface of the (001)-wafer. The reason therefor is explained as following.

Thermal stress is generated in wafers due to a temperature difference of the wafer surface generated when the wafer is put into and taken out of the furnace. Slip is generated at this time by a thermal stress exceeding a threshold shearing stress f. Slip in silicon wafers is governed by 12 slip systems, and the effect of thermal stress F on the slip systems is expressed as $$f = F \cos\alpha \cdot \cos\beta$$

where α is the angle between the thermal stress and the normal to the slip surface, and β is the angle between the thermal stress and the direction of the slip. As for the thermal stress F, since tangential stress σ predominates, and the value of cosα·cosβ in the presence of this stress was calculated for each crystal orientation of the wafer with respect to the 12 slip systems (FIG. 5).

The value becomes a minimum for [110] and [100] crystal orientations of the wafer. This means that these crystal orientations are such that exceeding the value of f is most unlikely. That is, slip generation is most unlikely when a certain predetermined thermal stress is generated in a wafer. Hence, it is desired to support the wafer at the positions corresponding to these crystal orientations.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the drawings.

First Embodiment

Figure 1:
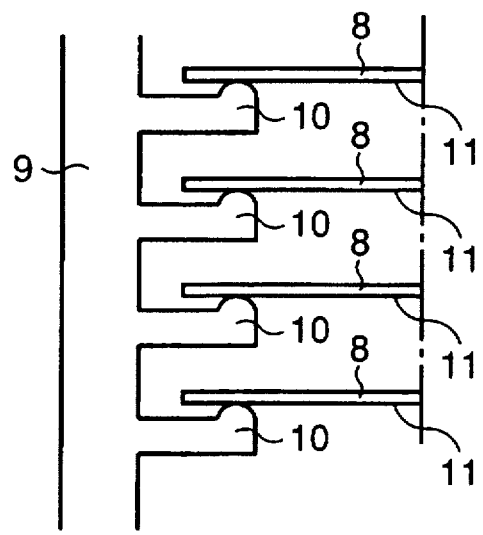
FIG. 1 is a sectional view showing a prior art wafer boat.
Figure 2:
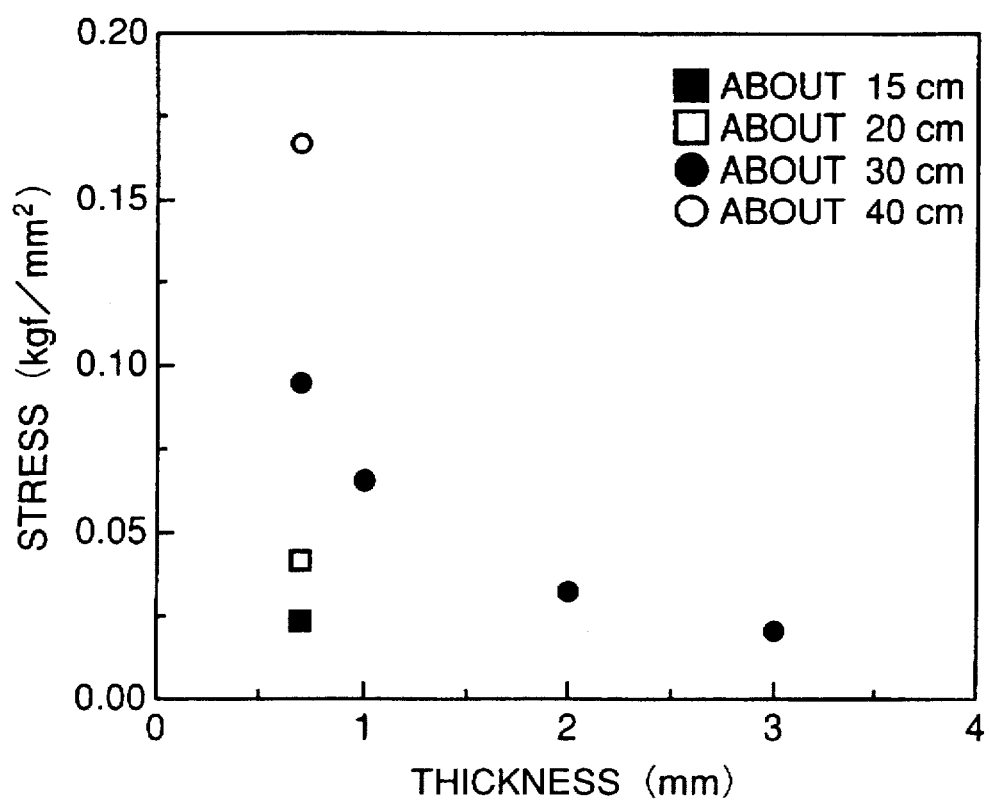
FIG. 2 is a graph showing the dependency of the maximum stress generated in a wafer due to the weight thereof on the wafer diameter and thickness.
Figure 3:
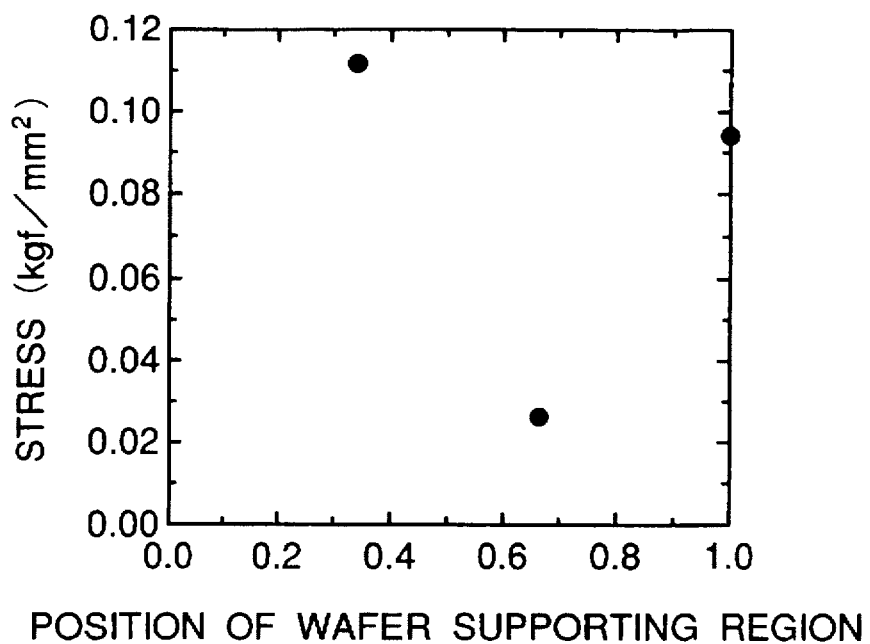
FIG. 3 is a graph showing the dependency of the maximum stress generated in 12-inch wafer having a thickness of 0.7 mm on the position of wafer supporting region.
Figure 4:
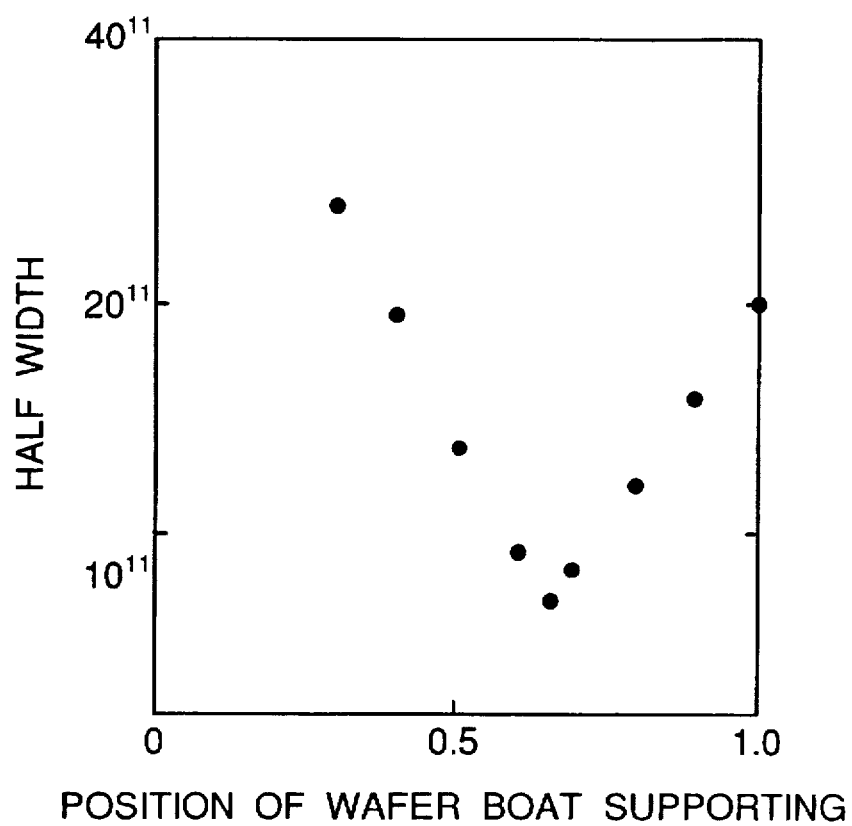
FIG. 4 is a graph showing the dependency of the X-ray diffraction half width on the wafer position supported by the wafer boat.
Figure 5:
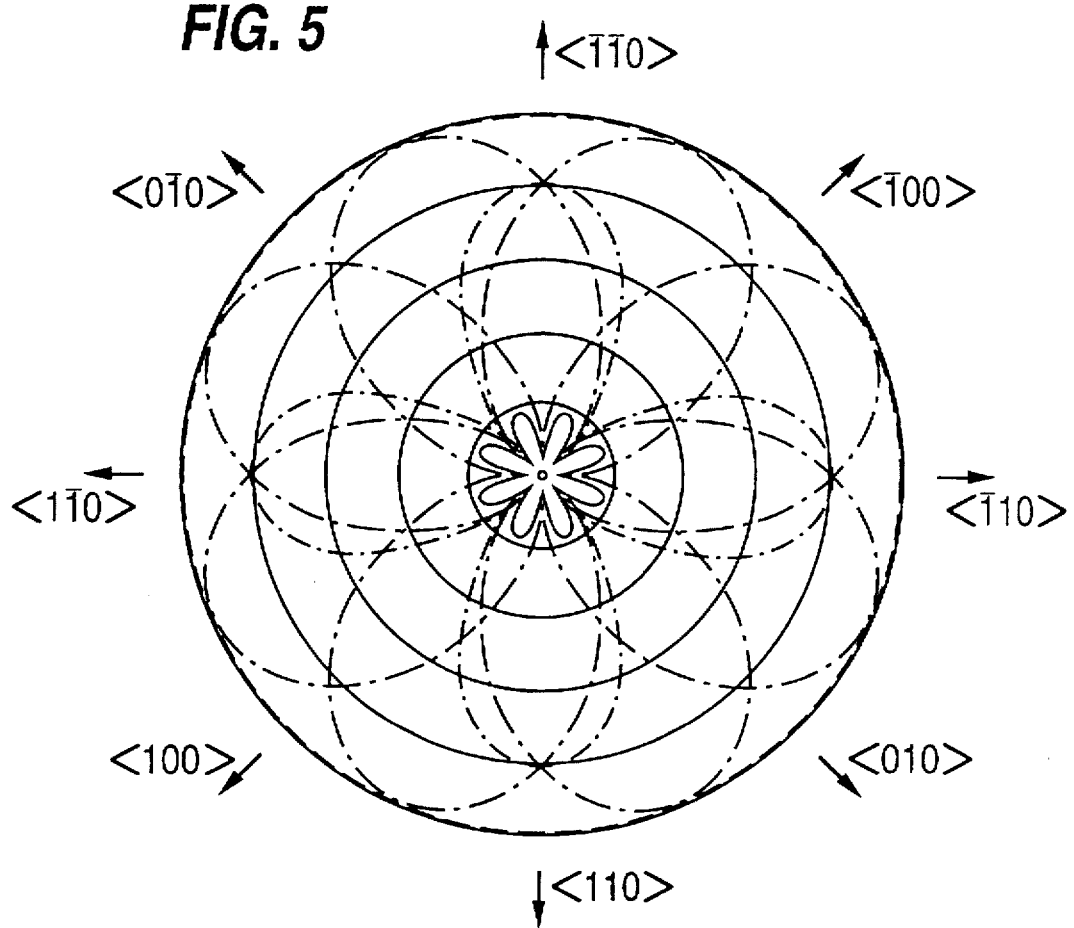
FIG. 5 is a graph showing the cosα·cosβ value of each slip system corresponding to tangential stress.
Figure 6:
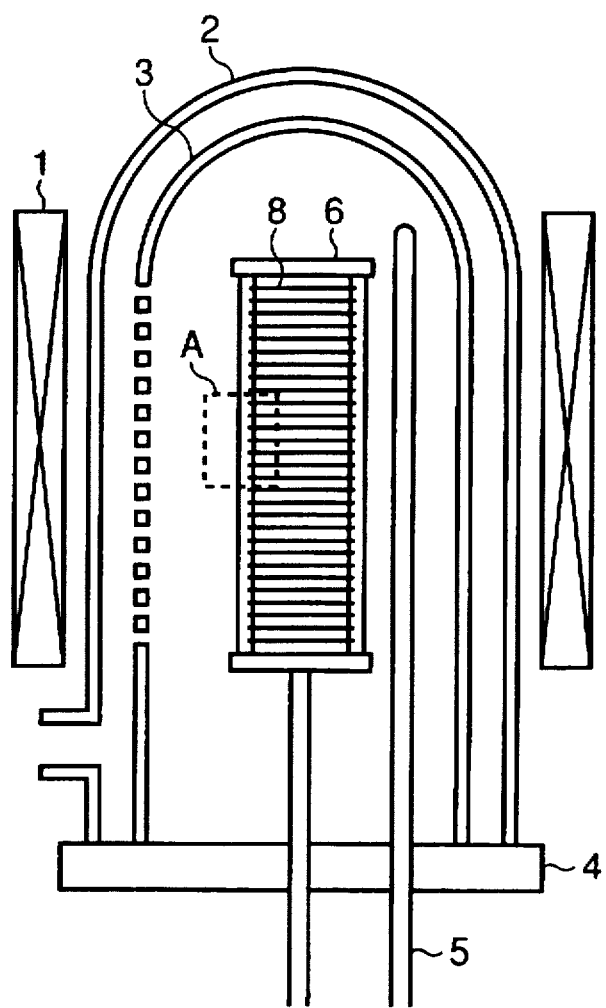
FIG. 6 is a sectional view showing a vertical diffusion furnace (or vapor growth furnace) for describing embodiments of the invention.

FIG. 6 is a sectional view showing a first embodiment of the invention. Referring to FIG. 6, a double pipe reaction structure is disposed in a vertical reaction heating furnace 1, and it comprises an outer pipe 2 and an inner pipe 3. The structure is supported on a base 4. A nozzle 5 for supplying reaction gas extends into the inner pipe 3. The wafer boat 6 is disposed in the inner pipe 3 such that it is rotatable about its vertical axis. In the wafer boat 6, a plurality of (001)-wafers 8 are supported one above another at a given interval.

Figure 7:
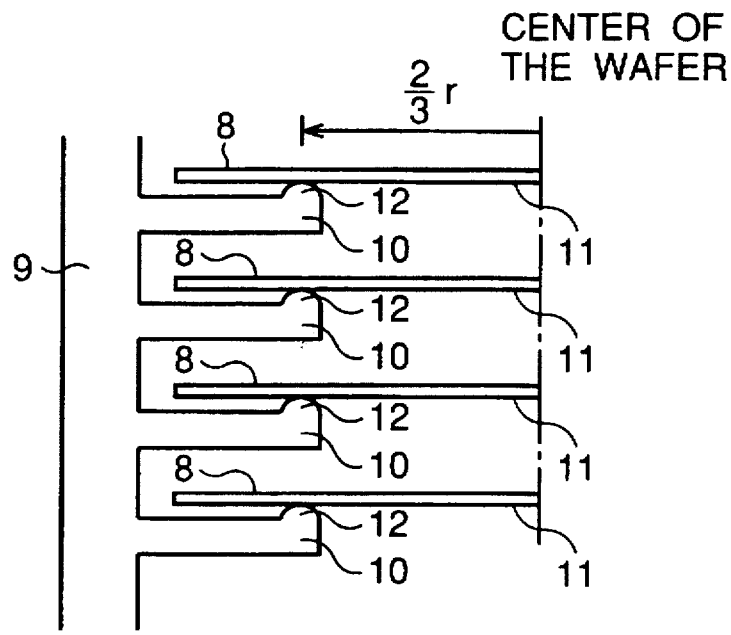
FIG. 7 is a sectional view showing a wafer boat for describing a first embodiment of the invention.

FIG. 7 is a sectional view, on an enlarged scale, showing a part enclosed in a dashed rectangle A in FIG. 6, i.e., showing supporting portions of the wafer boat in detail. The wafer boat 6 for supporting (001)-wafers 8 has a plurality of support posts 9 and supporting bars 10 extending therefrom. The support posts 9 extend essentially upright around the wafers 8, and the supporting bars 10 extend laterally from the support posts 9 into the wafer side. The supporting bars 10 have rounded protrusions 12, which support, in point contact, the back 11 of each (001)-wafer at positions spaced apart from the center of the wafer by a distance corresponding to two-thirds of the radius of the wafer.

Figure 8:
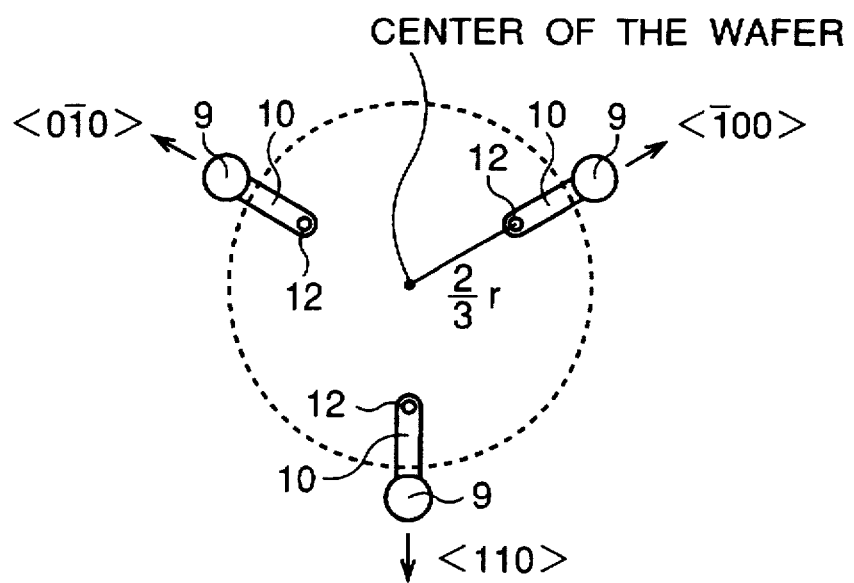
FIG. 8 is a plan view showing the wafer boat for describing the first embodiment.

FIG. 8 is a plan view showing the arrangement shown in FIG. 7. As shown, the protrusions 12 of the supporting bars 10 extending from the support posts 9 support the wafer back at three positions corresponding to $<0\bar{1}0>$, $<\bar{1}00>$, $<110>$ crystal orientations (in this text, "¯" indicates a negative direction, e.g., "$\bar{1}$"), these positions being spaced apart from the center of the (001)-wafer by a distance corresponding to two-thirds of the radius of the wafer.

Using the wafer boat according to the invention, twenty wafers 8 of about 30 cm (12 inches) in size were stacked one above another at a uniform interval of 20 mm, and heat treated in this state in a nitrogen atmosphere at a temperature of 1,100° C. that is attained at a ramping rate of 10° C./min. When a prior art wafer boat was used, many slips of 30 mm and above were generated in wafer regions supported by the wafer boat. With the wafer boat according to the first embodiment, no slip was found in the wafer regions supported by the wafer boat.

Second Embodiment

Figure 9:
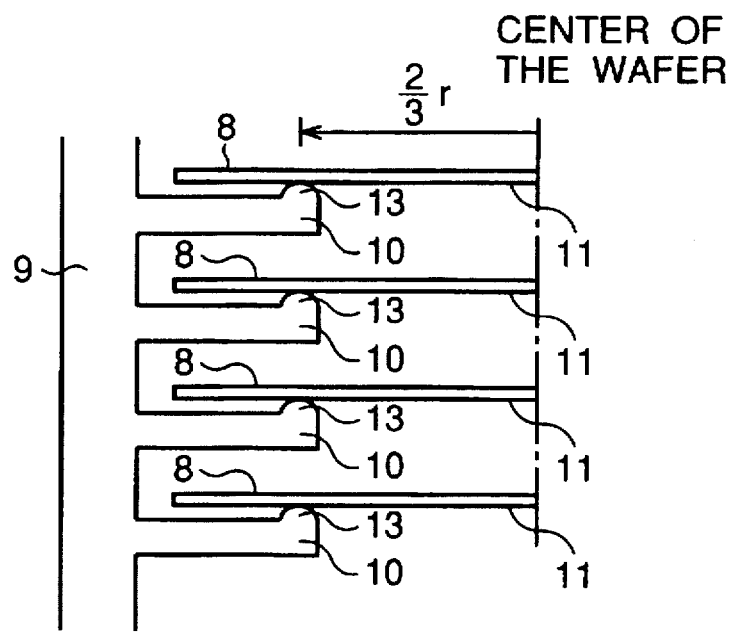
FIG. 9 is sectional view showing a wafer boat for describing a second embodiment of the invention.

FIG. 9 is a sectional view, on an enlarged scale, showing a part enclosed in a dashed rectangle A in FIG. 6, i.e., showing the structure of supporting portions of the wafer boat according to the second embodiment in detail. In the wafer boat 6 for supporting (001)-wafers 8, supporting bars 10 extend laterally from support posts 9 into the wafer side. Each supporting bar 10 has an arcuate line portion 13 formed at its free end for supporting the wafer back 11 at a position thereof spaced apart from the center of the wafer by a distance corresponding two-thirds of the radius of the wafer. The arcuate line portion 13 is in line contact with the back surface 11 of the supported wafer 8. The remainder of the construction of this embodiment is the same as that of the first embodiment shown in FIG. 7.

Figure 10:
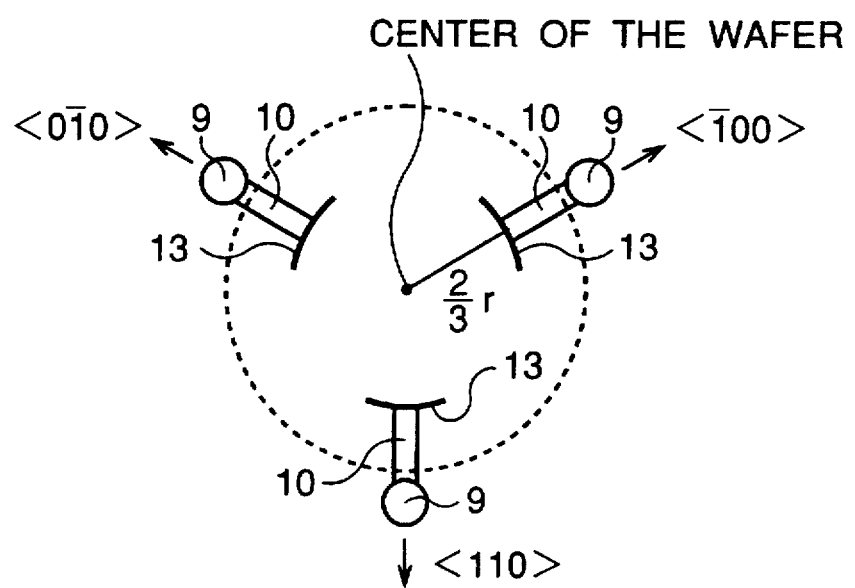
FIG. 10 is a plan view showing the wafer boat for describing the second embodiment of the invention.

FIG. 10 is a plan view showing the arrangement shown in FIG. 9. In the second embodiment, the back surface of each (001)-wafer is supported at three positions corresponding to $<0\bar{1}0>$, $<\bar{1}00>$, $<110>$ crystal orientations, these positions being spaced apart from the center of the wafer by a distance corresponding to two-thirds of the radius of the wafer by the arcuate line portions 13 of the supporting bars 10 extending from the support posts 9. Using this wafer boat, twenty wafers 8 of about 30 cm (12 inches) in size were stacked one over another at a uniform interval of 20 mm, and heat treated in this state in a nitrogen atmosphere at a ramping rate of 15° C./min. and at a temperature of 1,100° C. When a prior art wafer boat was used, many slips of 30 mm and above were generated in wafer regions supported by the wafer boat. With the wafer boat according to this embodiment, no slip was found in the wafer regions supported by the wafer boat.

Third Embodiment

Figure 11:
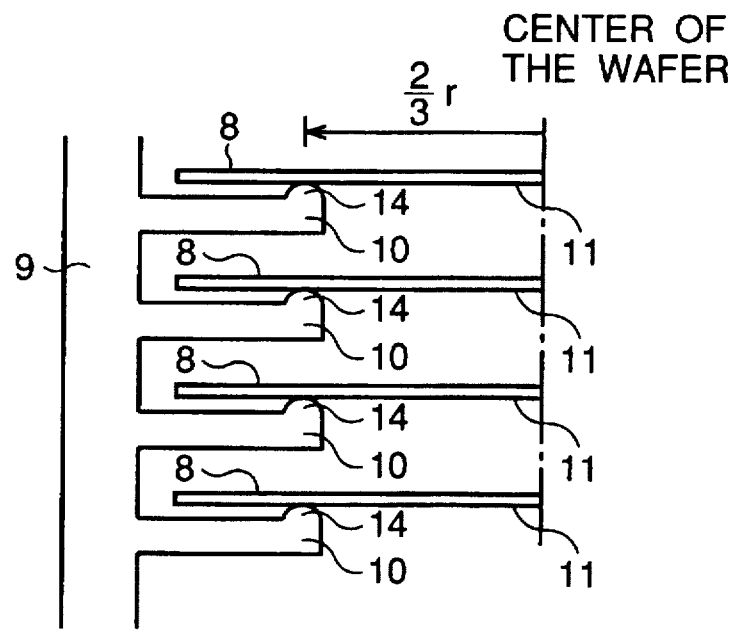
FIG. 11 is a sectional view showing a wafer boat for describing a third embodiment of the invention.

FIG. 11 is a sectional view, on an enlarged scale, showing a part enclosed by a dashed rectangle A in FIG. 6, i.e., showing the structure of the supporting portions of the wafer boat according to the third embodiment. In the wafer boat 6 for supporting wafers 8, supporting bars 10 extend laterally from support posts 9 into the wafer side. A ring 14 is provided such that it connects the free ends, i.e., inner ends of the supporting bars 10 and that it is in plane contact with the back surface 11 of each wafer 8 at positions spaced apart from the center of the wafer by a distance corresponding to two-thirds of the radius of the wafer. In this way, the ring 14 integral with the supporting bars 10 supports the wafer in plane contact with the back surface of the wafer.

Figure 12:
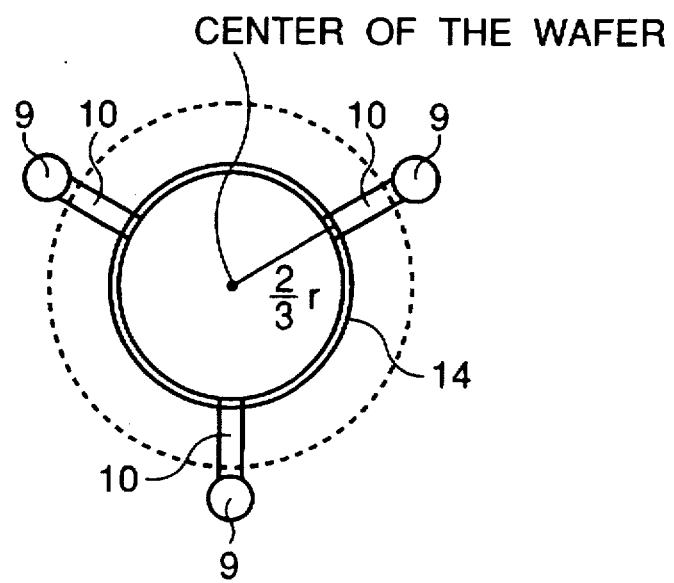
FIG. 12 is a plan view showing the wafer boat for describing the third embodiment of the invention.

FIG. 12 is a plan view showing the arrangement shown in FIG. 11. As shown, the back of the wafer is supported at positions spaced apart from the center of the wafer by a distance corresponding to two-thirds of the radius of the wafer by the ring 14 integral with the supporting bars 10 extending from the support posts 9. Using this wafer boat, twenty wafers 8 of about 30 cm (12 inches) in size are supported one above another at a uniform interval of 20 mm, and heat treated in a nitrogen atmosphere at a temperature of 1,100° C. that was attained at a ramping rate of 20° C./min. When a prior art wafer boat was used, many slips of 30 mm and above were generated in wafer regions supported by the wafer boat. With the wafer boat according to the embodiment, no slip was found in wafer regions supported by the wafer boat.

While above embodiments concerned the vertical diffusion furnace, the invention can also be applied to wafer boats for vapor growth furnaces.

As has been described in the foregoing, according to the invention, it is possible to suppress the stress generation caused by the weight of wafers, which stress increases as the diameters are increased, thus eliminating crystal defects in wafer regions in contact with the wafer boat in the heat treatment of wafers in a vertical diffusion furnace or a vertical vapor phase growth furnace. It is thus possible to eliminate adverse effects of crystal defects on device characteristics and obtain extremely significant effects for the device yield improvement.

It is further possible to suppress slip generation in supported regions of the wafer back corresponding to |100| and |110| crystal orientations. The |100| crystal orientation means any of the $<100>$, $<010>$, $<\bar{1}00>$, and $<0\bar{1}0>$ crystal orientations and the |110| crystal orientation means any of the $<\bar{1}\bar{1}0>$, $<1\bar{1}0>$, $<110>$, and $<\bar{1}10>$ crystal orientations.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A wafer boat for use with vertical furnaces and having a structure for supporting a plurality of wafers one above another at an interval, said structure comprising:

a plurality of support posts being disposed upright and essentially perpendicular to principal surfaces of said wafers at positions around said wafers, and a plurality of supporting bars each extending laterally from each of said support posts and supporting a back surface of each of said wafers at positions thereof spaced apart from a center of the wafer by a distance corresponding to two-thirds of the radius of the wafer.

2. A wafer boat according to claim 1, in which said wafers are (001)-wafers, and said supporting bars support said back surfaces of said wafers at positions thereof along one of |100| and |110| crystal orientations.

3. A wafer boat according to claim 2, in which said supporting bars have round protrusions for supporting said back surfaces of said wafers in point contact therewith.

4. A wafer boat according to claim 2, in which said supporting bars have line protrusion portions for supporting said back surfaces of said wafers in line contact therewith.

5. A wafer boat according to claim 1, in which said supporting bars have rings for supporting said back surfaces of said wafers in plane contact therewith.

* * * * *